United States Patent [19]

Ngaoaram

[11] Patent Number: 5,605,848
[45] Date of Patent: Feb. 25, 1997

[54] DUAL ION IMPLANTATION PROCESS FOR GATE OXIDE IMPROVEMENT

[75] Inventor: Sukhum Ngaoaram, Singapore, Singapore

[73] Assignee: Chartered Semiconductor Manufacturing Pte Ltd., Singapore, Singapore

[21] Appl. No.: 579,166

[22] Filed: Dec. 27, 1995

[51] Int. Cl.$^6$ ................................. H01L 21/265
[52] U.S. Cl. ................. 437/24; 437/37; 437/941
[58] Field of Search ................. 437/24, 37, 931, 437/941, 959; 148/DIG. 40

[56] References Cited

U.S. PATENT DOCUMENTS

| | | | |
|---|---|---|---|
| 4,897,368 | 1/1990 | Kobushi et al. | 437/200 |
| 5,108,935 | 4/1992 | Rodder | 437/24 |
| 5,382,533 | 1/1995 | Ahmad et al. | 437/941 |
| 5,393,676 | 2/1995 | Anjum et al. | 437/24 |

OTHER PUBLICATIONS

"Suppressed Process–Induced Damage in $N_2O$-annealed $SiO_2$ Gate Dielectrics" by A B Joshi et al. IEEE–IRPS, c. 1995, pp. 156–161.

*Primary Examiner*—Chandra Chaudhari
*Attorney, Agent, or Firm*—George O. Saile; Rosemary L. S. Pike

[57] ABSTRACT

A method for improving oxide quality by implanting both nitrogen and fluorine ions into the oxide layer through a polysilicon layer to prevent the penetration of impurities into the oxide layer is described. A layer of gate silicon oxide is grown over the surface of a semiconductor substrate. A polysilicon layer is deposited overlying the gate silicon oxide layer. Fluorine ions are implanted through the polysilicon layer wherein the fluorine ions congregate at the interface between the gate silicon oxide layer and the surface of the semiconductor substrate. Thereafter, nitrogen ions are implanted through the polysilicon layer wherein the nitrogen ions congregate at the interface between the gate silicon oxide layer and the surface of the semiconductor substrate. The substrate is annealed. The polysilicon and gate silicon oxide layers are patterned to form gate electrodes and interconnection lines. Source/drain ions are implanted to form source and drain regions within the semiconductor substrate using the gate electrodes and interconnection lines as a mask. Metallization with electrical connections completes the fabrication of the integrated circuit device.

14 Claims, 3 Drawing Sheets

DUAL ION IMPLANTATION PROCESS FOR GATE OXIDE IMPROVEMENT

BACKGROUND OF THE INVENTION (1) Field of the Invention

The invention relates to the fabrication of integrated circuit devices, and more particularly, to a method of improving gate oxide quality in the fabrication of integrated circuits.

(2) Description of the Prior Art

In the fabrication of integrated circuits, a layer of gate silicon oxide typically is grown on the surface of a monocrystalline silicon semiconductor substrate. A polysilicon layer is deposited overlying the gate oxide layer and patterned to form polysilicon gate electrodes. Penetration of the gate oxide layer by impurities can cause crystal damage in both oxide and silicon. Crystal damage can be annealed out. Damage is caused by energy imparted by the impurities to thin films.

Current practice is to passivate the oxide/silicon interface with chlorine using $Cl_2$, TCA or TCE. Interface passivation helps create an impact-resistant interface resulting in a smaller change in interface trap charges. Interface trap charges physically reside at the oxide/silicon interface and are believed to be due to incomplete bondings between silicon and silicon dioxide. A smaller change in interface trap charges leads to better oxide quality. However, upon exposure to radiation and/or plasma processes, the conventional means of passivation may no longer work.

U. S. Pat. 5,393,676 to Anjum et al discloses implanting Ar ions into polysilicon deeper than subsequent implantation of $BF_2$. The presence of the Ar ions prevents F ions from penetrating the underlying gate oxide. Nitrogen and fluorine have been identified as suitable elements for interface passivation as stronger interface bonds could be achieved. Nitrogen passivation has the advantage of being able to block boron ions from entering the oxide layer. Fluorine incorporation, on the other hand, can assist boron penetration into the oxide layer if given excessively. However, a significant advantage of fluorine passivation over nitrogen passivation is a higher low-field mobility which may be critical to device performance.

In their paper, "Suppressed Process-Induced Damage in $N_2O$-annealed $SiO_2$ Gate Dielectrics," by A. B. Joshi et al, IEEE - IRPS c. 1995, pp. 156–161, the authors discuss incorporating both nitrogen and fluorine to passivate the oxide/silicon interface by implanting fluorine ions into oxynitride through a polysilicon layer of suitable thickness. A process window for fluorine was previously determined. This process window was observed to be significantly narrower when switched from oxide to oxynitride followed by fluorination.

U. S. Pat. 4,897,368 to Kobushi et al implants nitrogen ions into a polysilicon layer followed by deposition of a titanium layer. The nitrogen ions in the polysilicon react with the titanium to form an alloy layer of uniform thickness. U.S. Pat. 5,108,935 to Rodder teaches implanting fluorine ions into the channel or base region of a semiconductor substrate to reduce hot carrier problems.

An alternative way to incorporate both elements into oxide would be to implant both nitrogen and fluorine ions through a layer of polysilicon.

SUMMARY OF THE INVENTION

A principal object of the present invention is to provide an effective and very manufacturable method of improving gate oxide quality.

A further object of the invention is to provide a method of improving oxide quality by preventing the penetration of impurities into the oxide layer.

Yet another object is to provide a method of improving oxide quality by implanting both nitrogen and fluorine ions into the oxide layer.

Yet another object is to provide a method of improving oxide quality by implanting both nitrogen and fluorine ions into the oxide layer through a polysilicon layer.

A still further object of the invention is to provide a method of improving oxide quality by implanting both nitrogen and fluorine ions into the oxide layer through a polysilicon layer to prevent the penetration of impurities into the oxide layer.

In accordance with the objects of this invention a method for improving oxide quality by implanting both nitrogen and fluorine ions into the oxide layer through a polysilicon layer to prevent the penetration of impurities into the oxide layer is achieved. A layer of gate silicon oxide is grown over the surface of a semiconductor substrate. A polysilicon layer is deposited overlying the gate silicon oxide layer. Fluorine ions are implanted through the polysilicon layer wherein the fluorine ions congregate at the interface between the gate silicon oxide layer and the surface of the semiconductor substrate. Thereafter, nitrogen ions are implanted through the polysilicon layer wherein the nitrogen ions congregate at the interface between the gate silicon oxide layer and the surface of the semiconductor substrate. The substrate is annealed. The polysilicon and gate silicon oxide layers are patterned to form gate electrodes and interconnection lines. Source/drain ions are implanted to form source and drain regions within the semiconductor substrate using the gate electrodes and interconnection lines as a mask. Metallization with electrical connections completes the fabrication of the integrated circuit device.

Also in accordance with the objects of this invention, an integrated circuit device having improved oxide quality is achieved. The integrated circuit device of the present invention comprises a patterned layer of gate silicon oxide over the surface of a semiconductor substrate, a layer of oxyfluoro-nitride at the interface between the gate silicon oxide layer and the semiconductor substrate, a patterned polysilicon layer overlying the patterned gate silicon oxide layer, source and drain regions within the semiconductor substrate, an insulating layer overlying the patterned polysilicon and gate silicon oxide layers, and a metal layer contacting the source and drain regions through openings in the insulating layer to complete electrical connections in the integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
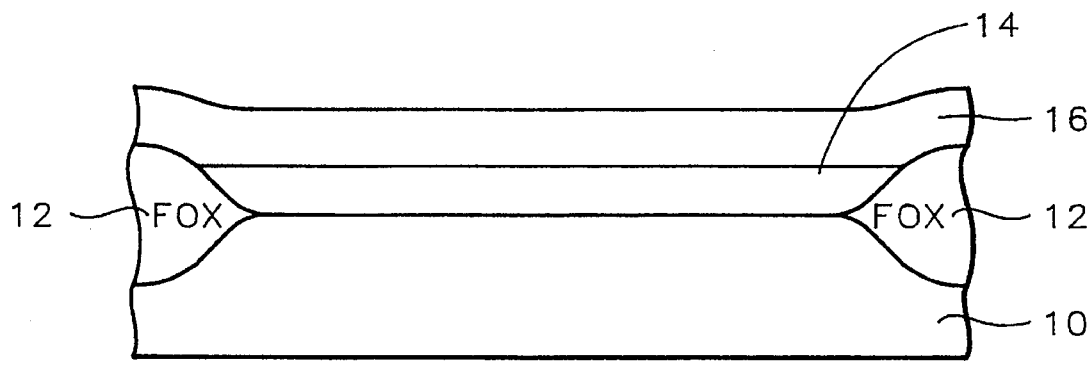
FIGS. 1 through 6 schematically illustrate in cross-sectional representation a preferred embodiment of the present invention.

Referring now more particularly to FIG. 1, there is shown an illustration of a portion of a partially completed integrated circuit. The semiconductor substrate 10 is preferably composed of silicon having a (100) crystallographic orientation. Field Oxide regions 12 are formed as are conventional in the art. The surface of the silicon substrate 10 is thermally oxidized to form the gate oxide layer 14.

Next, a layer of polysilicon 16 is deposited, for example, by low pressure chemical vapor deposition (LPCVD) to a suitable thickness of between about 1500 to 2000 Angstroms.

The key feature of the present invention is the implantation of both fluorine and nitrogen ions through the polysilicon into the gate oxide layer. As mentioned hereinabove, both fluorine and nitrogen passivations have their respective advantages and disadvantages. Achieving an optimal process of these two elements to passivate the interface can greatly improve oxide quality, and hence, provide for better MOS device performance.

The process of the invention is an improvement over the process described in the aforementioned paper by Joshi et al. A layer of oxy-fluoro-nitride is expected to form at the oxide/silicon interface better than in Joshi et al because the dosages of both fluorine and nitrogen are controlled through ion implantation whereas Joshi et al control only the dosage of fluorine. Only one annealing step is required in the process of the invention, improving the thermal budget. Additionally, the fluorination process window could be wider since the nitrogen implantation follows the fluorine implantation. Since fluorine bonds more strongly than nitrogen to dangling bonds, it should not be displaced by nitrogen so easily. Hence, more fluorine should be able to be introduced at this point.

Figure 2:
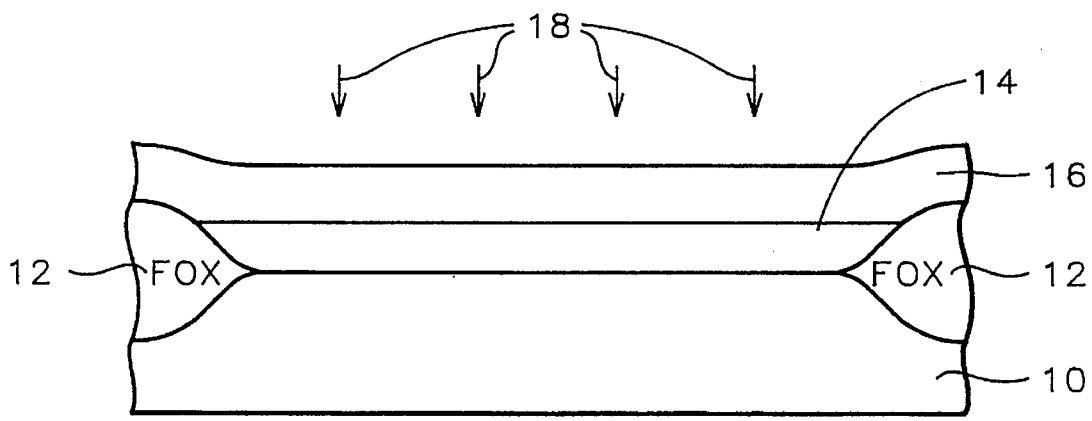
Figure 3:
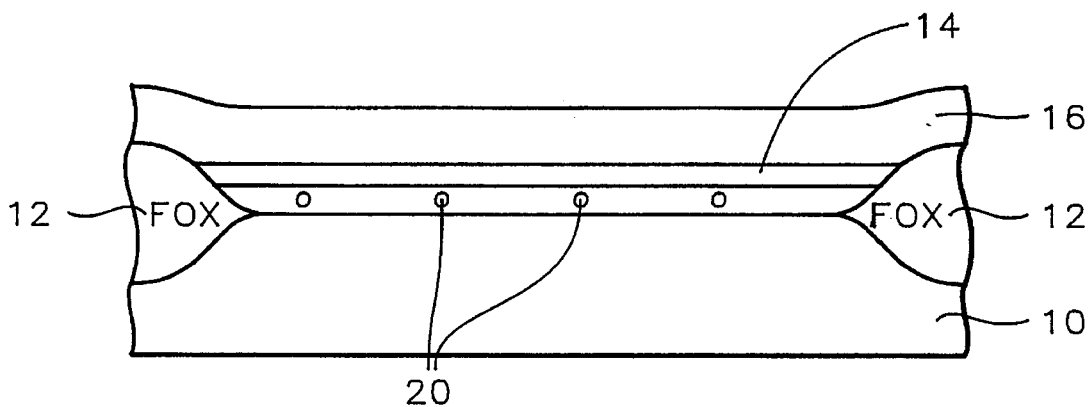

Referring now to FIG. 2, fluorine ions are implanted 18 through the polysilicon layer 16. As illustrated in FIG. 3, fluorine ions 20 congregate at the oxide/silicon boundary.

Figure 4:
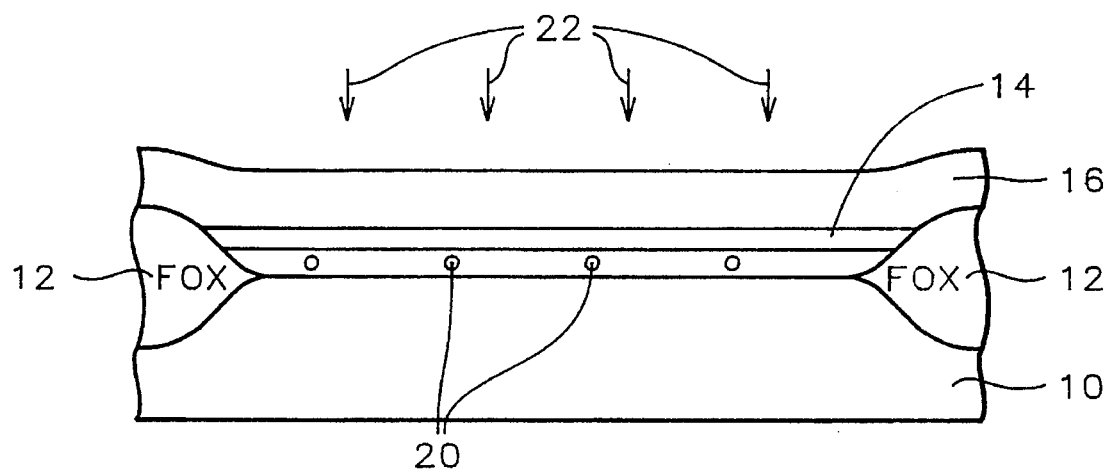
Figure 5:
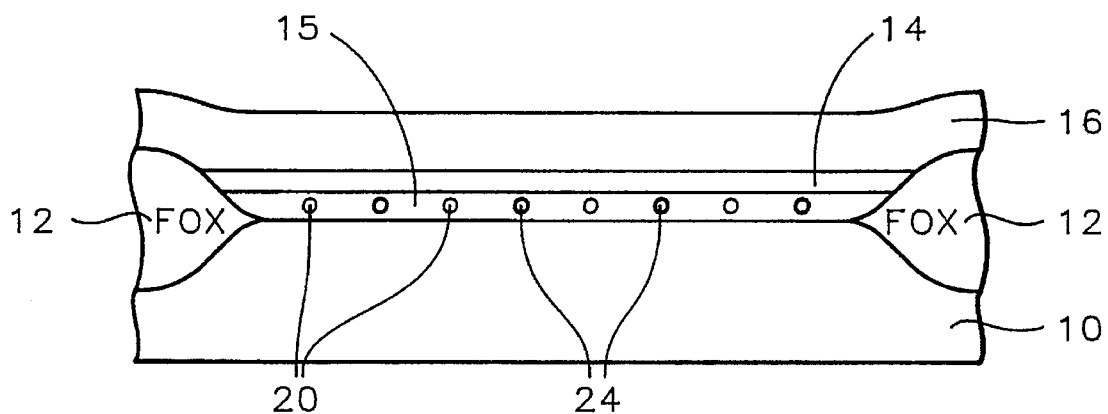

Referring now to FIG. 4, nitrogen ions are implanted 22 through the polysilicon layer 16. As illustrated in FIG. 5, nitrogen ions 24 along with the fluorine ions 20 congregate at the oxide/silicon boundary, forming a layer of oxy-fluoro-nitride 15 having a thickness of approximately 20 Angstroms.

The substrate is annealed to cure possible oxide damage done through the ion implantation. Annealing conditions are preferably in a nitrogen ambient at a temperature of between about 900° to 950° C.

Figure 6:
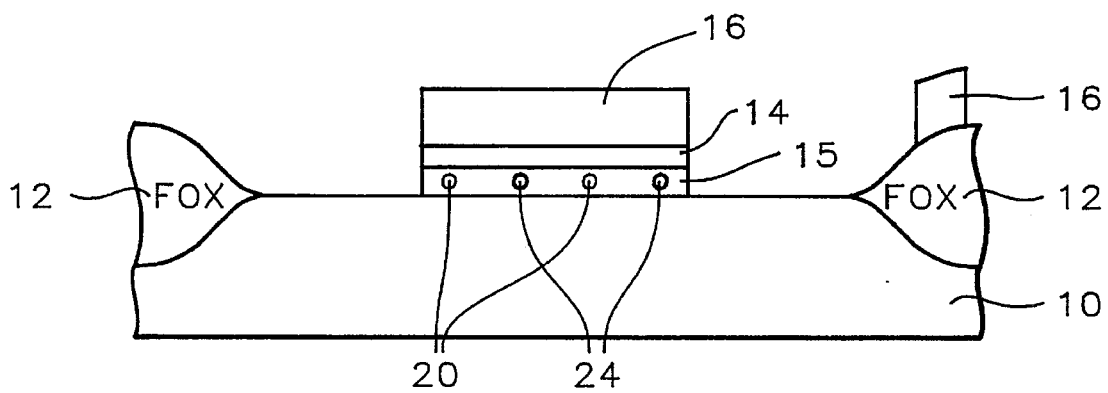

Next, the polysilicon and oxide layers 16 and 14 are patterned and etched to provide gate electrodes and interconnecting lines, as shown in FIG. 6.

Figure 7:
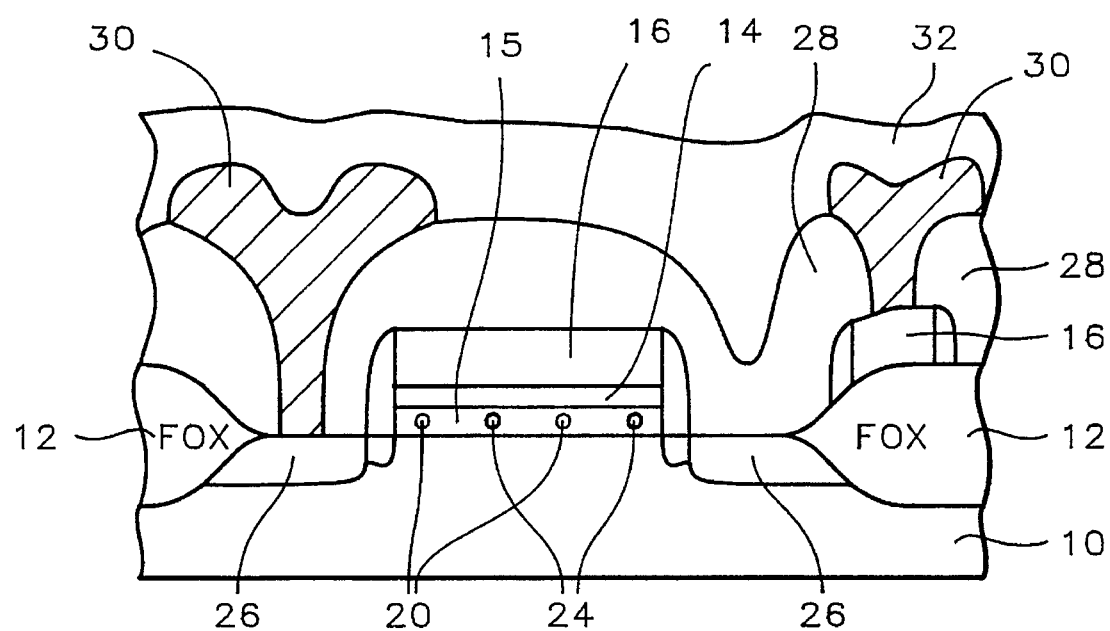
FIG. 7 schematically illustrates in cross-sectional representation a completed integrated circuit device fabricated by the process of the present invention.

The integrated circuit device is completed as is conventional in the art. For example, as illustrated in FIG. 7, source and drain regions 26 are formed within the semiconductor substrate, typically by arsenic ion implant. An insulating layer 28 is blanket deposited over the surface of the substrate. Openings are etched through the insulating layer to underlying source and drain regions and other areas where electrical contact is to be made. A conducting layer 30 is deposited and patterned to complete the electrical connections. A passivation layer 32 completes the fabrication of the integrated circuit device.

The process of the invention provides an effective method of fabricating an integrated circuit device with improved gate oxide quality and resulting enhanced device performance.

In accordance with another aspect of the present invention, an integrated circuit device having improved oxide quality is described with reference to FIG. 7. A gate oxide layer 14 underlies a polysilicon gate electrode 16. At the interface of the gate oxide and the silicon semiconductor substrate, fluorine and nitrogen ions, 20 and 24, congregate forming an oxy-fluoro-nitride layer 15. The presence of these ions prevents the penetration of the oxide layer by impurities such as boron thereby improving the quality of the gate oxide, and hence, the performance of the completed integrated circuit device.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit device comprising:

growing a layer of gate silicon oxide over the surface of a semiconductor substrate;

depositing a polysilicon layer overlying said gate silicon oxide layer;

implanting fluorine ions through said polysilicon layer wherein said fluorine ions congregate at the interface between the gate silicon oxide layer and the surface of the semiconductor substrate;

thereafter implanting nitrogen ions through said polysilicon layer wherein said nitrogen ions congregate at the interface between the gate silicon oxide layer and the surface of the semiconductor substrate;

annealing said substrate;

patterning said polysilicon and said gate silicon oxide layers to form gate electrodes and interconnection lines;

implanting source/drain ions to form source and drain regions within said semiconductor substrate using said gate electrodes and said interconnection lines as a mask; and providing metallization with electrical connections to complete the fabrication of said integrated circuit device.

2. The method according to claim 1 wherein said polysilicon layer is deposited by low pressure chemical vapor deposition to a thickness of between about 1500 to 2000 Angstroms.

3. The method according to claim 1 wherein said fluorine ions and said nitrogen ions congregating at said interface between said gate silicon oxide and the surface of said semiconductor substrate form an oxy-fluoro-nitride layer at said interface and wherein said oxy-fluoro-nitride layer has a thickness of about 20 Angstroms.

4. The method according to claim 1 wherein said annealing is performed in a nitrogen ambient at between about 900° to 950° C.

5. The method according to claim 1 wherein said fluorine and said nitrogen ions at said interface between said gate silicon oxide and said semiconductor substrate surface prevent the penetration of said source/drain ions into said gate silicon oxide layer.

6. A method of fabricating an integrated circuit device comprising:

growing a layer of gate silicon oxide over the surface of a semiconductor substrate;

depositing a polysilicon layer overlying said gate silicon oxide layer;

implanting fluorine ions through said polysilicon layer wherein said fluorine ions congregate at the interface between the gate silicon oxide layer and the surface of the semiconductor substrate;

thereafter implanting nitrogen ions through said polysilicon layer wherein said nitrogen ions congregate at the interface between the gate silicon oxide layer and the surface of the semiconductor substrate;

annealing said substrate;

patterning said polysilicon and said gate silicon oxide layers to form gate electrodes and interconnection lines;

implanting source/drain ions to form source and drain regions within said semiconductor substrate using said gate electrodes and said interconnection lines as a mask wherein said fluorine and said nitrogen ions at said interface between said gate silicon oxide and said semiconductor substrate surface prevent the penetration of said source/drain ions into said gate silicon oxide layer; and providing metallization with electrical connections to complete the fabrication of said integrated circuit device.

7. The method according to claim 6 wherein said gate silicon oxide layer has a thickness of between about 80 to 150 Angstroms.

8. The method according to claim 6 wherein said polysilicon layer is deposited by low pressure chemical vapor deposition to a thickness of between about 1500 to 2000 Angstroms.

9. The method according to claim 6 wherein said fluorine ions and said nitrogen ions congregating at said interface between said gate silicon oxide and the surface of said semiconductor substrate form an oxy-fluoro-nitride layer at said interface and wherein said oxy-fluoro-nitride layer has a thickness of about 20 Angstroms.

10. The method according to claim 6 wherein said annealing is performed in a nitrogen ambient at between about 900° to 950° C.

11. A method of forming a gate electrode and source and drain regions in the fabrication of an integrated circuit device comprising:

providing a polysilicon layer overlying a gate silicon oxide layer over the surface of a semiconductor substrate;

implanting fluorine ions through said polysilicon layer wherein said fluorine ions congregate at the interface between the gate silicon oxide layer and the surface of the semiconductor substrate;

thereafter implanting nitrogen ions through said polysilicon layer wherein said nitrogen ions congregate at the interface between the gate silicon oxide layer and the surface of the semiconductor substrate;

annealing said substrate;

patterning said polysilicon and said gate silicon oxide layers to form a gate electrode; and implanting source/drain ions to form source and drain regions within said semiconductor substrate using said gate electrode as a mask wherein said fluorine and said nitrogen ions at said interface between said gate silicon oxide and said semiconductor substrate surface prevent the penetration of said source/drain ions into said gate silicon oxide layer to complete the fabrication of said integrated circuit device.

12. The method according to claim 11 wherein said polysilicon layer is deposited by low pressure chemical vapor deposition to a thickness of between about 1500 to 2000 Angstroms.

13. The method according to claim 11 wherein said fluorine ions and said nitrogen ions congregating at said interface between said gate silicon oxide and the surface of said semiconductor substrate form an oxy-fluoro-nitride layer at said interface and wherein said oxy-fluoro-nitride layer has a thickness of about 20 Angstroms.

14. The method according to claim 12 wherein said annealing is performed in a nitrogen ambient at between about 900° to 950° C.

* * * * *